(12) United States Patent
Gupta et al.

(10) Patent No.: US 6,728,665 B1
(45) Date of Patent: Apr. 27, 2004

(54) SAT-BASED IMAGE COMPUTATION WITH APPLICATION IN REACHABILITY ANALYSIS

(75) Inventors: Aarti Gupta, Princeton, NJ (US); Zijiang Yang, Plainsboro, NJ (US); Pranav Ashar, Princeton, NJ (US)

(73) Assignee: NEC Corporation, Tokyo (JP)

( * ) Notice: Subject to any disclaimer, the term of this patent is extended or adjusted under 35 U.S.C. 154(b) by 660 days.

(21) Appl. No.: 09/693,979

(22) Filed: Oct. 23, 2000

Related U.S. Application Data

(60) Provisional application No. 60/190,101, filed on Mar. 20, 2000.

(51) Int. Cl.[7] .................................................. G06F 7/10
(52) U.S. Cl. ................................... 703/2; 716/4; 716/7
(58) Field of Search ........................ 703/2, 22; 716/4, 716/7, 18, 2

(56) References Cited

U.S. PATENT DOCUMENTS 5,594,656 A * 1/1997 Tamisier ...................... 703/13
6,408,262 B1 * 6/2002 Leerberg et al. ............... 703/2
6,591,400 B1 * 7/2003 Yang ............................ 716/2
6,654,715 B1 * 11/2003 Iwashita ...................... 703/22

\* cited by examiner

Primary Examiner—Albert W. Paladini
(74) Attorney, Agent, or Firm—Sughrue Mion, PLLC

(57) ABSTRACT

A method of performing image or pre-image computation for a system is disclosed. The method comprises representing the system by a finite state model; representing state sets using Binary Decision Diagrams (BDDs); performing a satisfiabilty checking (SAT) based backtrack search algorithm, wherein, the SAT decomposes the search over an entire solution space into multiple sub-problems, and wherein a BDD-based image computation is used to solve each sub-problem by enumerating multiple solutions from the solution space. Further, a method for pruning a search space in a SAT procedure is disclosed. The method comprises using BDD Bounding against an implicit disjunction or conjunction of a given set of BDDs; continuing search if a partial assignment of variables satisfies the implicit disjunction or conjunction, and backtracking if a partial assignment of variables does not satisfy the implicit disjunction or conjunction.

28 Claims, 8 Drawing Sheets

```
1   /* This function finds all solutions to a SAT Clause database,
2      using GRASP with BDD bounding, BDDs-at-SAT Leaves */
4   Find_all_solutions (Clause database, adds) {
5      if (Preprocess ( ) == FAILURE)
6         return FAILURE;
7      if (Bdd_bounding ( ) == FAILURE)
8         return FAILURE;
10     while (1) {// loop #1:exploring dec. tree to incr. depth
11        if (BDDs_at_Leaves ( ) ) {
13           handle_bdd_solution ( ); // stop exploring tree
14           /* for other solutions: backtrack chronologically */
15           if (Backtrack_chrono ( ) == FAILURE) {
16              return NO_MORE_SOLUTIONS;
17           } /*else backtracking takes place*/
18        } else {
19           /* explore tree to increased depth */
20           if (Select_next_variable ( ) == FAILURE)
21              break; /*out of loop #1 */
22        }
23        /* loop #2: check conflicts after decision / backtracking
       */
24        while (1) {
25           /*loop #3: while there is a logical conflict */
26           while (Deduce ( ) == CONFLICT) {
27              if (First_val ( ) | | Implied_Val( ) ) {
28                 /* perform diagnosis */
29                 if (Diagnose ( ) == CONFLICT) {
30                    /* the conflict cannot be resolved any more */
31                    return NO_MORE_SOLUTIONS;
32                 }
33                 /* else conflict driven backtracking takes place */
34              } else {
35                 /* second value of var; backtrack chronologically */
36                 if (Backtrack_chrono ( ) == FAILURE)
37                    return NO_MORE_SOLUTIONS;
38                 /* else backtracking takes place */
39              }
40           } /* end of loop #3 */
41           /* at this point, there is no conflict */
42           if (Bdd_Bounding ( ) == SUCCESS) {
43              if (Solution_found ( ) ) {
44                 handle_sat_solution ( );
45                 /* for other solutions: backtrack chronologically */
46                 if(Backtrack_chrono ( ) == FAILURE)
47                    return NO_MORE_SOLUTIONS;
49              } else { // else backtracking takes place
50                 /* unresolved clauses: Increase depth */
51                 break; // out of loop #2
52              }
53           } else { // BDD binding fails: backtrack chronologically
55              if (Backtrack_chrono ( ) - FAILURE)
56                 return NO_MORE_SOLUTIONS;
57           }
58        } // end of loop #2
59     } // end of loop #1
60     return SUCCESS;
61  }
```

```
Initialize ( ); // all var made "free"
do {
    Implications ( );
    status = Bound ( );
    if (status == contradiction)
        if (active_var->assigned_val ==
                active_var->first_val)
            active_var->assigned_val =
                !active_var->first_val ;
        else
            prev_var = Backtrack ( );
            if (prev_var == NULL)
                soln = no_soln;
                return;
            endif;
        endif
    else
        active_var = Next_free_var ( );
        if (active_var == NULL)
            soln = found;
            return;
        endif;
        active_var->first_val =
            active_var->assigned_val = Val ( );
    endif;
) While ( );
```

FIG. 2

```
Bound (sat, lit, input_bdd) {
    if (lit_is_input_set_variable{lit} ) {
      new_bdd =
      project_variable_in_bdd (input_bdd, lit);
      if {bdd_equal_zero{new_bdd} )
        return contradiction;
      else
        input_bdd = new_bdd;
    } // rest of the procedure is unchanged
}
```

FIG. 4

```
/* Each BDD node has a user-defined field that indicates if the sub-graph
below it is tautologically one, zero or neither (TWO_BDD) */
/* B_array is an array of BDD nodes, V_array is the array of variables and
their values */
    bdd_equal_zero (B_array, V_array) {
/* Leaves */
  if (any BDD in B_array is ZERO_BDD)
    return ZERO_BDD;
  if (each BDD is B_array is ONE_BDD)
    return ONE_BDD;
  if (only one BDD in B_array is TWO_BDD)
    return TWO_BDD;

/* Non-leaf case */
NewB_array = remove_one_bdds (B_array) ;
if (is_in_cache (NewB_array, &Val) )
    return Val;

/* get top var from all the BDDs in NewB_array */
Top_var = get_top_var(NewB_array) ;
ThanB_array = get_than(NewB_array, Top_var) ;
ElseB_array = get_else(NewB_array, Top_var) ;
Proj_value = get_proj_val(Top_var, V_array) ;
if (Proj_value == ONE) {
   Val = bdd_equal_zero(ThanB_array, V_array) ;
} else if Proj_value == ZERO) {
   Val = bdd_equal_zero(ElseB_array, V_array) ;
} else {
   Val0 = bdd_equal_zero(ThanB_array, V_array) ;
   Val1 = bdd_equal_zero(ElseB_array, V_array) ;
   if (Val0 == Val1 ) {
     Val = Val0;
   } else {
      Val = TWO_BDD;
   }
 }
    insert_in_cache(newB_array, Val);
    return Val;
 }
}
```

FIG. 5

```
Leaf_Image_Computation ( ) {
    // compute image according to Equation (3):
    // New(y) = path(y) ∧ ∃x", w", z". P(x)|_{Path(x)} ∧ Unsat(x", w", z", y")
    B = {projected P(x), projected unsat_clauses};        // set of BDDs
    do {
        v = min_cost_variable(B);   // choose variable v
        C = { b | b ε B, b depends on v };   // gather conjuncts for v
        c = and_smooth(C, v);   // quantify v along with conjunction
        replace(B, C, c);   // replace conjuncts C in B by c
    } while (variables_to_be_quantified);
    c = and (B);
    new = and(path(y), c);
}
```

FIG. 7

```
1  /* This function finds all solutions to a SAT Clause database,
2     using GRASP with BDD bounding, BDDs-at-SAT Leaves */
4  Find_all_solutions (Clause database, adds) {
5    if (Preprocess () == FAILURE)
6      return FAILURE;
7    if (Bdd_bounding () == FAILURE)
8      return FAILURE;
10   while (1) {// loop #1:exploring dec. tree to incr. depth
11     if (BDDs_at_Leaves ( ) ) {
13       handle_bdd_solution ( ); // stop exploring tree
14       /* for other solutions: backtrack chronologically */
15       if (Backtrack_chrono () == FAILURE) {
16         return NO_MORE_SOLUTIONS;
17       } /*else backtracking takes place*/
18     } else {
19       /* explore tree to increased depth */
20       if (Select_next_variable () == FAILURE)
21         break; /*out of loop #1 */
22     }
23     /* loop #2: check conflicts after decision / backtracking
       */
24     while (1) {
25       /*loop #3: while there is a logical conflict */
26       while (Deduce () == CONFLICT) {
27         if (First_val () || Implied_Val( ) ) {
28           /* perform diagnosis */
29           if (Diagnose () == CONFLICT) {
30             /* the conflict cannot be resolved any more */
31             return NO_MORE_SOLUTIONS;
32           }
33           /* else conflict driven backtracking takes place */
34         } else {
35           /* second value of var: backtrack chronologically */
36           if (Backtrack_chrono () == FAILURE)
37             return NO_MORE_SOLUTIONS;
38           /* else backtracking takes place */
39         }
40       } /* end of loop #3 */
41       /* at this point, there is no conflict */
42       if (Bdd_Bounding () == SUCCESS) {
43         if (Solution_found ( ) ) {
44           handle_sat_solution ( );
45           /* for other solutions: backtrack chronologically */
46           if(Backtrack_chrono () == FAILURE)
47             return NO_MORE_SOLUTIONS;
49         } else {// else backtracking takes place
50           /* unresolved clauses: Increase depth */
51           break ; // out of loop #2
52         }
53       } else {// BDD bnding fails: backtrack chronologically
55         if (Backtrack_chrono () - FAILURE)
56           return NO_MORE_SOLUTIONS;
57       }
58     } // end of loop #2
59   } // end of loop #1
60   return SUCCESS;
61 }
```

FIG. 8

SAT-BASED IMAGE COMPUTATION WITH APPLICATION IN REACHABILITY ANALYSIS

The present Application claims priority from the co-pending U.S. Provisional Patent Application Serial No. 60/190,101, filed Mar. 20, 2000, the contents of which are incorporated herein by reference.

I. DESCRIPTION

I.A. Field

The present disclosure is related to image and pre-image computation. Specifically, this disclosure teaches a technique that combines Binary Decision Diagram (BDD)-based techniques and Satisfiability Testing (SAT)-based techniques to exploit their complementary benefits.

I.B. Background

Image and pre-image computation play a central role in symbolic state space traversal, which is at the core of a number of applications in Very Large Scale Integrated Circuits (VLSI) Computer Aided Design (CAD) like verification, synthesis, and testing. Exact reachability analysis for sequential system verification is emphasized in this disclosure, though the techniques can also be used for exact invariant checking, exact model checking, approximate reachability analysis, approximate invariant checking, and approximate model checking. For simplicity and easier understanding, only image computation is considered. It should be noted that, the techniques presented could be used for pre-image computation as well.

I.B.1. BDD-based Methods

Verification techniques based on symbolic state space traversal rely on efficient algorithms based on BDDs for computing the image of an input set over a Boolean relation. For further details on symbolic state space traversal, see J. R. Burch, E. M. Clarke, D. E. Long, K. L. McMillan, and D. L. Dill; and Symbolic model checking for sequential circuit verification. *IEEE Transactions on Computer-Aided Design*, 13(4):401–424, April 1994, and O. Coudert, C. Berthet, and J. C. Madre. Verification of synchronous sequential machines using symbolic execution. In *Proceedings of the International Workshop on Automatic Verification Methods for Finite State Systems*, Volume 407 of Lecture Notes in Computer Science, pages 365–373, June 1989. For further details on BDDs, see R. E. Bryant. Graph-based algorithms for Boolean function manipulation. *IEEE Transactions on Computers*, C-35(8):677–691, August 1986.

The input set for the verification problem is the set of present states P, and the Boolean relation is the transition relation T, i.e., the set of valid present-state, next-state combinations. In case of hardware, it is also convenient to include the primary inputs in the definition of T. The use of BDDs to represent the characteristic function of the relation, the input, and the image set, allows image computation to be performed efficiently through Boolean operations and variable quantification. As an example of an application, the set of reachable states is computed by starting from a set P which denotes the set of initial states of a system, and using image computation iteratively, until a fixpoint is reached.

A number of researchers have proposed the use of partitioned transitioned relations, where the BDD for the entire transition relation is not built a priori. See J. R. Burch, E. M. Clarke, and D. E. Long. Representing circuits more efficiently in symbolic model checking, In *Proceedings of the 28th Design Automation Conference*, pages 403–407, June 1991; and H. J. Touati, H. Savoj, B. Lin, R. K. Brayton, and A. Sangiovanni-Vincentelli. Implicit state enumeration of finite state machines using BDDs. In *Proceedings of the International Conference on Computer-Aided Design*, pages 130–133, 1990.

Typically, the partitions are represented using multiple BDDs, and their conjunction is interleaved with early variable quantification during image computation. Many heuristics have been proposed to find a good quantification schedule, i.e., an ordering of the conjunctions which minimizes the number of peak variables. For more details, see D. Geist and I. Beer. Efficient model checking by automatic ordering of transition relation partitions, in *Proceedings of the International Conference on Computer-Aided Verification*, Volume 818 of Lecture Notes in Computer Science, pages 299–310, 1994; and R. K. Ranjan, A. Aziz, R. K. Brayton, B. F. Plessier, and C. Pixley. Efficient BDD algorithms for ESM synthesis and verification, in *International Workshop for Logic Synthesis*, May 1995. Lake Tahoe, Calif. Further, there has also been an interest in using disjunctive partitions of the transition relations and state sets, which effectively splits the image computation into smaller sub-problems. For more details, see G. Cabodi, P. Camurati, and S. Quer. Improving the efficiency of BDD-based operators by means of partitioning, *IEEE Transactions on Computer-Aided Design of Integrated Circuits and Systems*, 18(5):545–556, May 1999; I.-H. Moon, J. Kukula, K. Ravi, and F. Somenzi. To split or to conjoin: The question in image computation, in *Proceedings of the Design Automation Conference*, pages 23–28, June 2000; and A. Narayan, A. J. Isles, J. Jam, H. K. Brayton, and A. Sangiovanni-Vincentelhi. Reachability analysis using partitioned ROBDDs, in *Proceedings of the International Conference on Computer-Aided Design*, pages 388–393, 1997.

Importantly, BDD-based techniques work well when it is possible to represent the sets of states and the transition relation using BDDs. The representation-can be as a whole, or in a usefully partitioned form. However, BDD size is very sensitive to various factors including: the number of variables, variable ordering, and the nature of the logic expressions being represented. In spite of a large body of conventional work, the verification techniques based purely on BDD technique have been unreliable for designs of realistic size and functionality.

I.B.2. Combining BDDs with SAT-based Methods

On the other hand, an alternative technique used extensively in testing applications, uses Conjunctive Normal Form (CNF) to represent transition relation and further, uses Boolean Satisfiability Checking (SAT) for performing analysis. For more details, see T. Larrabee., Test pattern generation using Boolean satisfiability, *IEEE Transactions on Computer-Aided Design of Integrated Circuits and Systems*, 11(1):4–15, January 1992. SAT solver technology has improved significantly in recent years with a number of sophisticated packages now available, e.g. J. P. Marquez-Silva, Grasp package, http://algos.inesc.pt/jpms/software.html.

For checking equivalence of two given combinational circuits $C_1$ and $C_2$, a typical approach is to prove that the XOR of their corresponding outputs can never evaluate to 1, as shown in FIG. 1. Such an XOR of the corresponding output is also called the miter circuit output. A proof for the above proposition can be provided either by building a BDD for the miter, or by using a SAT solver to prove that no satisfying assignment exists for the miter output. In cases where the two methods fail individually, BDDs and SAT can also be combined, for example, in the manner shown in FIG. 1. A cut is identified in the miter circuit to divide the circuit into, two parts: the part $P_I$ of the circuit between the circuit inputs and the cut, and the part $P_O$ of the circuit between the cut and the output. A BDD is built for $P_O$, while $P_I$ is represented in CNF. A SAT solver then tries to enumerate all valid combinations at the cut using the CNF for $P_I$, while checking that it is not contained in the on-set of the BDD for $P_O$. See A. Gupta and P. Ashar. Integrating a Boolean satisfiability checker and BDDs for combinational verification. In *Proceedings of the VLSI Design Conference*, January 1998. Enumerating the valid combinations at the cut corresponds exactly to computing the image of the input set over the Boolean relation corresponding to $P_I$. Other ways of combining BDDs and SAT for equivalence checking have also been proposed. See J. Burch and V. Singhal. Tight integration of combinational verification methods. In *Proceedings of the International Conference on Computer-Aided Design*, pages 570–576, 1998.

For property checking, the effectiveness of SAT solvers for finding bugs has also been demonstrated in the context of bounded model checking and symbolic reachability analysis. See P. A. Abdulla, P. Bjesse, and N. Een. Symbolic reachability analysis based on SAT-solvers. In *Tools and Algorithms for the Analysis and Construction of Systems* (TACAS), 2000, A. Biere, A. Cimatti, B. M. Clarke, and Y. Zhu. Symbolic model checking without BDDs. In *Tools and Algorithms for the Analysis and Construction of Systems* (TACAS), Volume 1579 of Lecture Notes in Computer Science, 1999, and P. Williams, A. Biere, E. M. Clarke, and A. Gupta. Combining decision diagrams and SAT procedures for efficient symbolic model checking. In *Proceedings of the International Conference on Computer-Aided Verification*, Volume 1855 of Lecture Notes in Computer Science, pages 124–138, 2000. The common theme is to convert the problem of interest into a SAT problem, by devising the appropriate propositional Boolean formula, and to utilize other non-canonical representations of state sets. However, they all exploit the known ability of SAT solvers to find a single satisfying solution when it exists. However, no attempt has been made to formulate the problems in a way that a SAT solver is used to find all satisfying solutions.

In this respect, the disclosed technique should be distinguished from Moon et al., who independently formulated a decomposition paradigm. See I.-H. Moon, J. Kukula, K. Ravi, and F. Somenzi. To split or to conjoin: The question in image computation. In *Proceedings of the Design Automation Conference*, pages 23–28, June 2000. However, there are significant differences in the details that are discussed in section IV.E.

The necessary background on a typical SAT decision procedure is in the next sub-section. The preferred embodiment is discussed in detail in section IV. Towards the end, experimental results for reachability analysis, using an embodiment of the present invention, are provided. The results validate the individual ideas and the overall approach of the disclosed techniques.

I.B.3. Satisfiability Checking (SAT)

The Boolean Satisfiability (SAT) problem is a well-known constraint satisfaction problem with many applications in computer-aided design, such as test generation, logic verification and timing analysis. Given a Boolean formula, the objective is to either find an assignment of 0–1 values to the variables so that the formula evaluates to true, or establish that such an assignment does not exist. The Boolean formula is typically expressed in Conjunctive Normal Form (CNF), also called product-of-sums form. Each sum term (clause) in the CNF is a sum of single literals, where a literal is a variable or its negation. An n-clause is a clause with n literals. For example, (vi+vj'+vk) is a 3-clause. In order for the entire formula to evaluate to 1, each clause must be satisfied, i.e., evaluate to 1.

The complexity of this problem is known to be NP-Complete. In practice, most of the conventional SAT solvers are based on the Davis-Putnam algorithm. See M. Davis and H. Putnam. A computing procedure for quantification theory. *Journal of the ACM*, 7:201–205, 1960. The basic algorithm begins from an empty assignment, and proceeds by assigning a 0 or 1 value to one free variable at a time. After each assignment, the algorithm determines the direct and transitive implications of that assignment on other variables, typically called bounding. If no contradiction is detected during the implication procedure, the algorithm picks the next free variable, and repeats the procedure. Otherwise, the algorithm attempts a new partial assignment by complementing the most recently assigned variable for which only one value has been tried so far. This step is called backtracking. The algorithm terminates either when all clauses have been satisfied and a solution has been found, or when all possible assignments have been exhausted. The algorithm is complete in that it will find a solution if it exists.

Pseudo code for the basic Davis-Putnam search procedure is shown in FIG. 2. The function and variable names have obvious meanings. This procedure has been refined over the years by means of enhancements to the Implications ( ), Bound( ), Backtrack ( ), Next_free_var( ) and Val( ) functions. The GRASP work proposed the use of non-chronological backtracking by performing a conflict analysis, and addition of conflict clauses to the database in order to avoid repeating the same contradiction in the future. See J. P. Marques-Silva and K. A. Sakallah. Grasp: A new search algorithm for satisfiability. In *Proceedings of the International Conference on Computer-Aided Design*, pages 220–227, November 1996.

II. SUMMARY OF THE INVENTION

To overcome the above-mentioned problems in conventional technologies it is an objective of the present invention to provide improved methods for image and pre-image computation.

It is another objective of the present invention to provide improved methods for pruning the search space.

In the disclosed image computation technique BDDs are used to represent state sets, and a CNF formula to represent the transition relation. All valid next state combinations are enumerated using a backtracking search algorithm for SAT that exhaustively visits the entire space of primary input, present state and next state variables. However, rather than using SAT to enumerate each solution all the way down to a leaf, BDD-based image computation is invoked at intermediate points within the SAT decision procedure, which effectively obtains all solutions below that point in the search tree. The disclosed technique can be regarded as SAT providing a disjunctive decomposition of the image computation into many sub-problems, each of which is handled using BDDs.

To meet the objectives of the present invention, there is provided a method of performing image computation for a system, said method comprising representing the system by a finite state model, representing state sets using Binary Decision Diagrams (BDDs), performing a satisfiabilty checking (SAT) based backtrack search algorithm, wherein, the SAT decomposes the search over an entire solution space into multiple sub-problems, and wherein a BDD-based image computation is used to solve each sub-problem by enumerating multiple solutions from the solution space.

Preferably the method is used to perform, exact or approximate—reachability analysis, invariant checking, or model checking.

Preferably, transition relation of the said finite state model is represented using a conjunctive normal form (CNF).

Preferably, complement of a dynamically changing image set is used as a care-set within the search algorithm.

Preferably, the search in SAT is pruned by using BDD Bounding against an implicit disjunction or conjunction of a given set of BDDs, such that the search continues if a partial assignment to variables satisfies the implicit disjunction or conjunction, and backtracks otherwise, said BDD Bounding is further accomplished by applying said BDD Bounding against the implicit disjunction of BDDs which represent the input set, and applying said BDD Bounding against the implicit conjunction of BDDs which represent care sets for the image set.

Preferably the disjunctive decomposition in SAT is accomplished by assigning values to decision variables chosen according to SAT-based heuristics, such as number of clauses a variable appears in; and BDD-based heuristics, such as size of input set and care-set BDDs cofactored with respect to a variable.

Preferably an extent of disjunctive decomposition in SAT is adaptive.

Still preferably the BDD-based image computation procedure determines the multiple solutions by creating a set of BDDs comprising a BDD for each unsatisfied clauses in the CNF representation, adding an input set BDD to said set of BDDs, projecting partial assignment of variables on BDDs in said set of BDDs, choosing a minimum cost variable to quantify, said choice determined by a cost function depending upon: sizes of BDDs in a subset of said set of BDDs, such that the chosen variable appears in each BDD of said subset, an estimate of the size of the product of BDDs in said subset, sizes of variable support sets of BDDs in said subset, and number of variables that can be quantified; performing conjunction of all BDDs in the subset, along with quantification of the chosen variable, and any other variables to be quantified which do not appear in remaining BDDs in the set of BDDs, the remaining BDDs being said subset removed from said set of BDDs;

replacing the subset of BDDs by result of the conjunction and quantification in the previous step; iterating the steps of choosing a minimum cost variable, performing conjunction with quantification, and replacement until there are no more variables to be quantified, and performing a conjunction of the remaining BDDs in the set with a BDD representing a partial assignment of next-state variables.

Still preferably, a BDD-based sub-problem is initiated based on a cost function depending on a number of unassigned variables, size of Bounding BDDs after projection of assigned variables.

Still preferably, a BDD-based sub-problem can be aborted even after initiation due to resource limitations, whereupon SAT is used to decompose the problem further.

Another aspect of the present invention is to use the above methods for pre-image computation as opposed to image computation.

Yet another aspect of the present invention is a method for pruning a search space in a SAT procedure said method comprising using BDD Bounding against an implicit disjunction or conjunction of a given set of BDDs, continuing search if a partial assignment of variables satisfies the implicit disjunction or conjunction, and backtracking if a partial assignment of variables does not satisfy the implicit disjunction or conjunction.

Preferably BDD Bounding against a single BDD is used multiple times for handling said disjunction, wherein search is continued if and only if a partial assignment of variables satisfies any BDD in the given set; and BDD Bounding against multiple BDDs is used for handling said conjunction.

Still preferably, said BDD Bounding procedure against a single BDD is performed by: setting values of assigned variables in a list; and determining that a partial assignment satisfies the BDD if there exists a path in the BDD to a "one" node in accordance with said values.

Still preferably, said BDD Bounding procedure against multiple BDDs is performed by setting values of assigned variables in a list, traversing multiple BDDs in a lock-step manner in accordance with said values; and determining that a partial assignment satisfies the conjunction if there exists a path in the lockstep traversal of said BDDs that leads to a "one" node.

III. BRIEF DESCRIPTION OF THE DRAWINGS

FIG. 2 shows a backtracking search procedure for SAT.

FIG. 4 lists a pseudo-code for single bounding against a single BDD.

FIG. 5 lists a pseudo-code for multiple bounding against a conjunction of multiple BDDs with projections.

Figure 6:
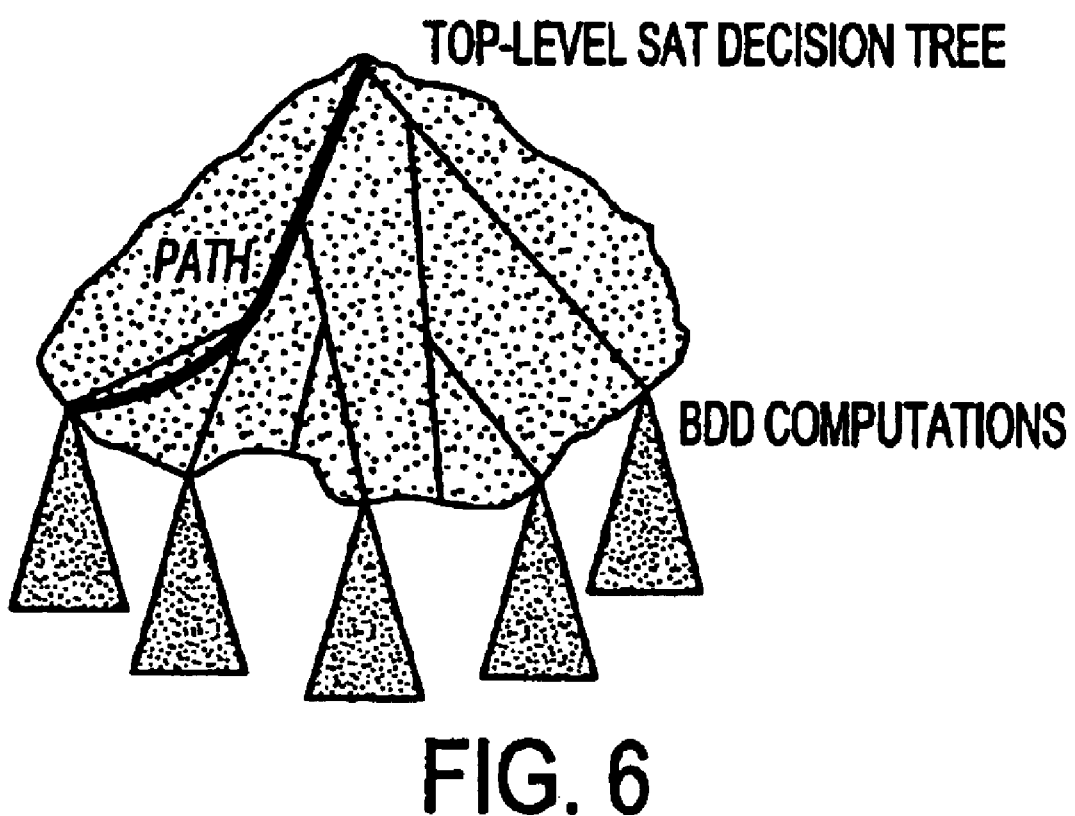

FIG. 6 shows BDDs at SAT leaves.

FIG. 7 lists a pseudo-code for an embodiment of leaf image computation.

FIG. 8 lists a pseudo-code for an embodiment of a complete SAT-BDD image computation procedure.

IV. DETAILED DESCRIPTION OF THE PREFERRED EMBODIMENTS

IV.A. Image Computation

A preferred embodiment of the disclosed technique for image computation by combining BDD- and SAT-based techniques in a single integrated framework is described herein. The disclosed techniques are largely specific to their use for image computation. The disclosed techniques are orthogonal to features found in state-of-the-art SAT algorithms like GRASP, and indeed add to them. For further details about grasp, see P. Marquez-Silva. Grasp package. http://algos.inesc.pt/jpms/software.html.

IV.A.1. Representation Framework

The representation framework used herein comprises using BDDs to represent the input and image sets, while a CNF formula is used to represent the Boolean relation. This choice is motivated by the fact that BDD-based methods frequently fail because of their inability to effectively manipulate the BDD(s) for the transition relation, in its entirety or in partitioned form. Furthermore, since BDDs for the input and image sets might also become large for complex systems, the present technique does not require that a single BDD be used to represent these sets. Any disjunctively decomposed set of BDDs will work with the present technique.

Figure 1:
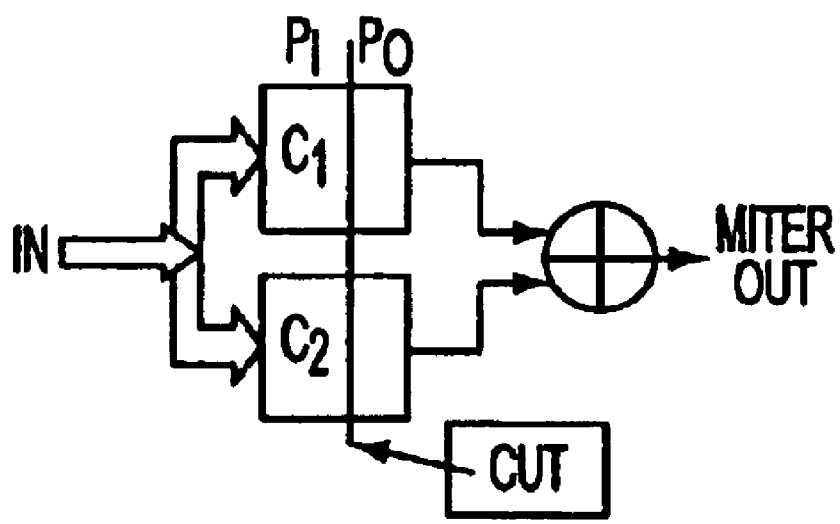
FIG. 1 shows a miter circuit for combinational verification.
Figure 3:
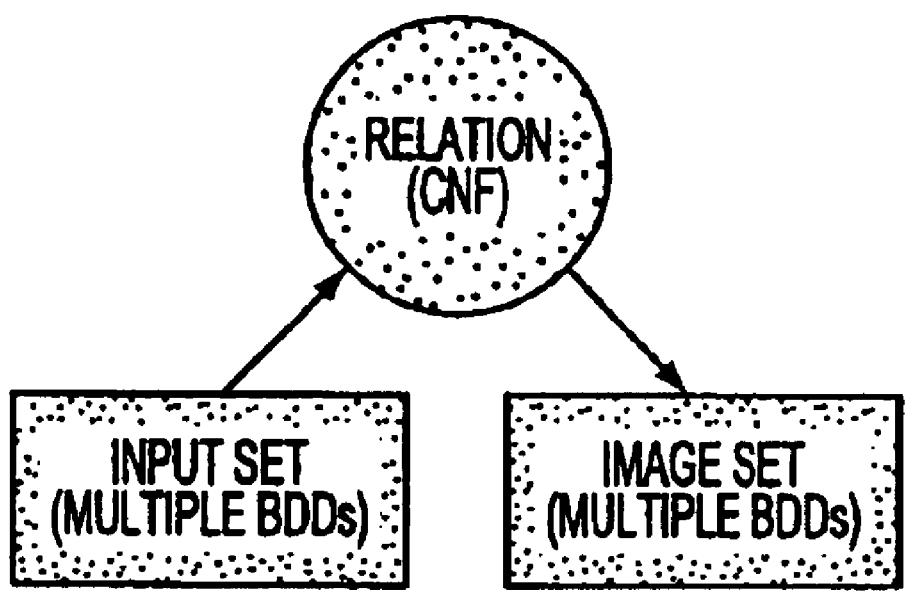
FIG. 3 shows a CNF-BDDs representation setup.

This setup is shown pictorially in FIG. 3. In the disclosed embodiment, a simple "chronological" disjunctive partitioning is used, such that whenever the BDD size for a set being accumulated crosses a threshold, a new BDD is created for storing future additions to the set. However, a skilled artisan should know that alternative representations can be used to manage these sets without deviating from the spirit and scope of the present invention.

IV.A.2. Image Computation Using CNF-BDDs

The standard image computation formula is shown below in Equation (1), where x, y, and w denote the set of present state, next state, and primary input variables, respectively; P(x) denotes the input set, and T(x, w, y) denotes the transition relation.

$$\text{Image }(P,T)(y) = \exists x, w. P(x)\hat{\,}T(x, w, y) \qquad (1)$$

In the framework used to describe the preferred embodiment, P(x) and Image(y) are represented as (multiple) BDDs, while T is represented as a CNF formula in terms of x, w, y and some additional variables z, which denote internal signals in the circuit. The image set is computed by enumerating all solutions to the CNF formula T, and recording only the combinations of y variables, while restricting the values of x variables to those that satisfy P(x). Note that by restricting the x variables to satisfy P(x), conjunction is effectively performed in the above formula. This restriction is performed by BDb Bounding. Essentially, during the SAT search procedure, any partial assignment to the x variables that does not belong to the on-set of the BDD(s) P(x) is pruned immediately. See A. Gupta and P. Ashar. Integrating a Boolean satisfiability checker and BDDs for combinational verification. In *Proceedings of the VLSI Design Conference*, January 1998. Note also, that by enumerating all (not a single) solution to the CNF formula, and by considering combinations of only y variables among these solutions, quantification is effectively performed over all the other variables (x, w, z).

Unreached(y) is used as a care-set for the image set. In applications such as reachability analysis, where image computation is performed iteratively, this set can be computed as the negation of the current set of reached states. Again, by using BDD(s) to represent Unreached(y), additional pruning of the SAT search space can be obtained by performing BDD Bounding against this image care-set. To summarize, the following equation is used for image computation:

$$\text{Image}(P,T)(y) = \exists x, w, z, P(x)\hat{\,}T(x, w, z, y)\hat{\,}\text{Unreached }(y) \qquad (2)$$

IV.B. BDD Bounding

A naive approach for performing BDD Bounding is to enumerate each complete SAT solution up to the leaf of the search tree, and then check if the solution satisfies the given BDD(s). This is obviously inefficient since the number of SAT solutions may be very large.

In the present setup, the x/y variables are shared between the input/image set BDD(s) and the CNF formula. Therefore, whenever a value is set to or implied on one of these variables in SAT, a determination is made if the intersection of the partial assignment with the given BDD(s) is non-null. If it is indeed non-null, the SAT procedure proceeds forward. Otherwise it backtracks, since no solution consistent with the conjunctions can be found under this subtree.

Some of the present inventors had used a similar technique called the Early Bounding approach, and had demonstrated a significant reduction in the number of backtracks due to pruning off large subspaces of the search tree. For details, see A. Gupta and P. Ashar. Integrating a Boolean satisfiability checker and BDDs for combinational verification. In *Proceedings of the VLSI Design Conference*, January 1998. Note that the smaller the bounding set, the greater the pruning, and the faster the SAT solver is likely to be.

IV. B.1. Bounding Against the Image Set: A Positive Feedback Effect

In addition to bounding against the input set P(x) and the image care-set Unreached(y), a fundamental speed-up in the present image computation procedure can be obtained by also bounding against the BDDs of the currently computed image set denoted Current(y). Note that Unreached(y) does not change during a single image computation, while Current(y) is updated dynamically, as new solutions for the image set are enumerated. Therefore, if a partial assignment over y variables is contained in Current(y), it implies that any extension to a full assignment has already been enumerated. Therefore, it serves no purpose for the SAT solver to explore further, and it can backtrack. As a result, a positive feedback effect is created in which the larger the image set grows, the faster the SAT solver is likely to be able to go through the remaining portion of the search space.

IV.B.2. Implementation Details: Bounding the x Variables

For BDD Bounding against P(x), the Boundo function of FIG. 2 is modified, so that it checks the satisfaction of a partial assignment on x variables with the on-set of the BDDs for P(x). Again, if the partial assignment has a null intersection with each BDD, the SAT solver is made to backtrack, just as if there were a contradiction.

The pseudo-code for the Bound ( ) procedure for a single BDD is shown in FIG. 4. In this procedure, the initial argument is the BDD for P(x), and the recursive argument maintains its projected version down the search tree. The project_variable-in-bdd( ) procedure, can be easily implemented by using either the bdd_substitute( ) or the bdd_cofactor( ) operations available in standard BDD packages. For details on examples of such standard packages, see F. Somenzi et al. CUDD: University of Colorado Decision Diagram Package. http://visi.colorado.edu/fabio/CUDD/. But then, these standard BDD operations represent a considerable overhead in terms of unique table and cache lookups. On the other hand in the present, a simple association list is used to keep track of the x variable assignments. Projecting (un-projecting) a variable is accomplished simply by setting (un-setting) its value in the association—a constant-time operation. However, checking against a zero_bdd requires a traversal of the argument BDD, by taking branches dictated by the variable association. If any path to a one_bdd is found, the traversal is terminated, and the BDD is certified to be not equal to the zero_bdd. In the worst case, this takes time proportional to the size of the BDD. As a further enhancement, for each BDD node, a value indicating the presence or absence of a path is associated to a one_bdd from that node. This bit must be modified only if the value of a variable below this node is modified. As a result, the average complexity of the emptiness check is likely better than the BDD size.

IV.B.3. Implementation Details: Bounding the y Variables

During the SAT search, if the intersection of a partial assignment over y variables and (Unreached(y)$\hat{\,}$?Current(y)) is non-null, exploration should proceed further down that path, otherwise it can backtrack.

Recall that use of a disjunctive partitioning of the reached state set $R = U_1 R_i$ is permitted Therefore, both the Unreached and !Current sets can be represented as product of BDDs, i.e., Unreached(y)=∩!$R_1$(y), and !Current(y)=r)!Current$_1$(y). Rather than performing an explicit product of the multiple BDDs, the partial assignment over y variables is projected separately onto each BDD. Then the multiple BDDs are traversed in a lock-step manner by using a modified bdd_equal_zero( ) procedure, to determine if there exists a path in their product that leads to a one_bdd. The pseudo code for this is shown in FIG. 5, where the given procedure assumes that projection of variable values onto the individual BDDs has already been carried out. In the actual implementation, the projection of variables and detection of emptiness are done in a single pass, along with handling of complemented BDD nodes. The worst-case complexity is that of actually computing a complete product, but in practice the procedure terminates as soon as any path to one_bdd is found.

IV.C. BDDs at SAT Leaves

So far techniques for image computation have been explained in terms of enumerating all solutions of the CNF formula using SAT-solving techniques, while performing BDD Bounding where possible in order to prune the search space. This still suffers from some drawbacks of a purely SAT-based technique, i.e., solutions are enumerated one-at-a-time, without any reuse. To some extent, this drawback is countered by examining partial solutions (cubes) for inclusion and for pruning, but it can actually be improved still further.

It is useful in this regard to compare a purely SAT-based technique, vs. a purely BDD-based technique. In essence, both work on the same search space of Boolean variables—SAT solvers use an explicit decision tree, while BDD operations work on the underlying DAGs (Directed Acyclic Graphs). A BDD-based technique is more suitable for capturing all solutions simultaneously. However, due to the variable ordering restriction, it can suffer from a size blowup in the intermediate/final results. On the other hand, a SAT decision tree has no variable ordering restriction, and can therefore potentially manage larger problems. However, since it is not canonical, many sub-problem computations may get repeated.

In order to combine the relative advantages of both, the present technique uses a SAT decision tree to organize the top-level search space. Within this tree, along any path, rather than using the SAT-solver to explore the tree further, BDD-based technique can be invoked to compute all solutions in the sub-tree under that path. This integrated scheme, which is called BDDs at SAT Leaves, is illustrated pictorially in FIG. 6. In a sense, the SAT decision tree can be regarded as a disjunctive partitioning of a large problem at the root into smaller sub-problems at the leaves, each of which can be handled by a purely BDD-based technique.

IV.C.1. Leaf Sub-problem: BDD-based Image Computation

The formulation of the BDD sub-problem to be solved at each leaf of the SAT decision tree is shown below:

$$\text{New}(y) = \text{Path}(y') \exists x'', w'', z''.P(x)|_{Path(x')} \text{Unsat}(x'', w'', z'', y'') \quad (3)$$

This computes the image set solutions New from a sub-tree rooted at the end of a path in the SAT decision tree. Here, for a set of variables v, the assigned set is denoted v', and the unassigned set is denoted v''. Path(x')/Path(y') denote the BDDs representing the partial assignment of x/y variables along the path. Unsat(x'', w'', z'', y'') denotes the product of all unsatisfied clauses at the end of the path, projected by the assigned variables along that path, expressed in terms of the unassigned variables appearing in the original CNF formula. Finally, $P(X)|_{path(x')}$ denotes the restriction of the set P(x) to the partial assignments of x along the path.

Note that in this equation, the part following the existential quantification is identical in formulation to a standard purely BDD-based technique. The difference is only in the granularity of the Boolean relation Unsat, and its conjunctive decomposition. In a standard approach, the Boolean relation T(x, w, y) is a transition relation, expressed in terms of the present state, primary input, and next state variables only. Furthermore, its conjunctive decomposition is typically based on splitting the next state variables.

In the disclosed technique, the Boolean relation is expressed as a CNF formula over the set of present state, primary input, next state, and intermediate variables denoting signals on internal gates that implement the next state logic of the sequential circuit. Furthermore, the conjunctive decomposition follows the structural decomposition of the circuit into gates. Though this finer-grained approach must handle more number of Boolean variables than the standard approach, it also allows a greater potential for early quantification, which has been noted to help overcome the blowup during image computation (described in detail in the next section).

Another benefit of using the fine-grained CNF partitions is that there is no penalty for performing pre-image computations. Many researchers have noted that backward symbolic traversal is less efficient than forward traversal. This is partly due to having to handle the typically irregular unreachable part of the state space. Furthermore, most methods use partitions based on splitting the next state (y) variables, while sharing the present state (x) variables. This scheme is good for performing image computations with early quantification of x variables, but it does not work very well for pre-image computations where the y variables need to be quantified. In contrast, our fine-grained CNF formulation is symmetric with respect to the x and y variables. Therefore, the disclosed technique can be applied equally well for image as well as pre-image computations.

IV.C.2. Leaf Sub-problem: Quantification Schedule

In practice, it is important to choose a good quantification schedule, i.e., an ordering on the conjunctions of the partitions that avoids intermediate blowup during image computation. Typically, a good schedule tries to minimize the number of active variables in a linearized schedule, by analyzing the variable support sets of the individual partitions. For details, see D. Geist and I. Beer. Efficient model checking by automatic ordering of transition relation partitions. In *Proceedings of the International Conference on Computer-Aided Verification*, Volume 818 of Lecture Notes in Computer Science, pages 299–310, 1994; I.-H. Moon, J. Kukula, K. Ravi, and F. Somenzi. To split or to conjoin: The question in image computation. In *Proceedings of the Design Automation Conference*, pages 23–28, June 2000; and R. K. Ranjan, A. Aziz, R. K. Brayton, B. F. Plessier, and C. Pixley. Efficient BDD algorithms for ESM synthesis and verification. In *International Workshop for Logic Synthesis*, May 1995. Lake Tahoe, Calif.

The details of the disclosed leaf computation procedure when the input set P(x) is represented herein using a single BDD. When P(x) is represented as a disjunction of multiple BDDs, then the described leaf computation is repeated independently for each BDD in the disjunction, and a disjunction of the resulting solutions is taken to be the solution for the sub-problem.

For each leaf image computation, the pseudo-code for the quantification schedule is shown in FIG. 7. The procedure starts with a collection B of BDDs consisting of the projected P(x) (and potentially Unreached(y)), and a BDD for every projected unsatisfied clause. Next, a variable v to be quantified is selected heuristically. The minimum cost variable is chosen in a greedy fashion, where cost is estimated as the product of the individual BDD sizes that the variable appears in. Once v is selected, all conjuncts that v appears in is gathered in set C. This is followed by conjunction and quantification of v in C, and this result replaces the set C in B. (Since the y variables cannot be quantified, they are never choosen). This basic loop is iterated until no more variables can be quantified. The remaining BDDs (with only y variables) are conjoined together, and the result is conjoined with path(y) (the cube of assigned y variables), to give the set of new image solutions corresponding to that path.

Note that this formulation does not depend on a live variable analysis over a linearized schedule but considers the actual BDD sizes for selection. Therefore, it is better able to balance the computation in the form of a tree of conjunctions, rather than a linear series of conjunctions. In related experiments, this heuristic performed far better than others based on variable supports.

IV.D. The Complete Image Computation Procedure

An embodiment of a complete procedure for enumerating all solutions of the image set is shown in FIG. 8. This embodiment is built as an improvement over the publicly available GRASP SAT-solver. See P. Marquez-Silva. Grasp package. http://algos.inesc.pt/jpms/software.html. It should be noted that Grasp is used merely as an illustrative example. The scope of the present invention should not be construed to be restricted to Grasp.

An original skeleton is described herein. After the initial preprocessing, the procedure consists of an outer loop #1 (line 10) that explores the SAT decision tree to increased depth if necessary. The inner loop #2 (line 24) is used primarily to propagate constraints and check for conflicts after either a decision variable is chosen, or after backtracking takes place to imply a certain value on a variable. Loop #3 (line 26) actually performs the deduction to check for contradictions and tries to resolve the conflict using diagnosis until there is no more conflict. In GRASP, clauses are added to record causes of all backtracking operations, including those used to enumerate multiple solutions.

The completeness argument for the disclosed procedure with respect to finding all solutions of the image set is based largely on the completeness of the original procedure in GRASP. See J. P. Marques-Silva. *Search Algorithms for Satisfiability Problems in Combinational Switching Circuits*. PhD thesis, EECS Department, University of Michigan, May 1995. The improvements that have been made to the original procedure consist of introducing the techniques of BDDs at SAT Leaves (lines 11–18), and BDD Bounding (lines 7–8, lines 42–57). The original procedure have been further modified to perform conflict analysis only if the value of the decision variable is the first value being tried, or if its second value has been implied (line 27).

The correctness of finding all BDD solutions at the leaves, and of pruning the search space when BDD Bounding fails follows from the arguments described in the previous sections. Note that in both these cases, a chronological backtracking (lines 14–17, lines 54–56) is performed in order to search for the next solution. In case BDD Bounding succeeds (line 42), it is determined whether a solution is found, i.e., whether all clauses are satisfied. If they are, a SAT solution has been found, which is handled in the usual way, followed by chronological backtracking to find the next solution (lines 45–48).

The reason for the modification (line 27) is that addition of clauses to record the causes of chronological backtracking is to be avoided. In this embodiment, which is in the form of a modified GRASP algorithm, chronological backtracking takes place after a solution has been found, or after BDD Bounding fails. However, when clauses for chronological back-tracking are not recorded, GRASP's conflict analysis during diagnosis becomes incomplete, and it may be erroneous to perform non-chronological backtracking based on this conflict analysis. Therefore, if the second value of a variable is implied by some clause (either an original, or a conflict clause), diagnosis can take place. Otherwise, non-chronological backtracking is disabled by not performing any diagnosis at all. Instead, a simple chronological back-tracking is performed (lines 34–39). Note that performing chronological backtracking instead of non-chronological backtracking can at most affect the procedure's efficiency, not its completeness.

IV.E. Why SAT?

As mentioned earlier, there has been recent interest in using disjunctive decompositions of the image computation problem using purely BDDs, with substantially improved practical results. See G. Cabodi, P. Camurati, and S. Quer. Improving the efficiency of BDD-based operators by means of partitioning. *IEEE Transactions on Computer-Aided Design of Integrated Circuits and Systems*, 18(5):545–556, May 1999, and I.-H. Moon, J. Kukula, K. Ravi, and F. Somenzi. To split or to conjoin: The question in image computation. In *Proceedings of the Design Automation Conference*, pages 23–28, June 2000. Our use of a SAT decision tree to split the search tree, and use of the BDD-based image computations at its leaves to perform the conjoining, results in a similar decomposition. However, SAT provides many more advantages than just a disjunctive decomposition, which also differentiate the disclosed technique from conventional techniques.

In particular, it allows us to easily perform implications of a variable decision (splitting). In principle, deriving implications can be done in non-SAT contexts as well, e.g., directly on circuit structure, using BDDs etc. However, this has not been done in practice for image computation. By using a standard state-of-the-art SAT package, the years of progress in this direction, as well as in related techniques of efficient backtracking and conflict analysis, is utilized which will help toward pruning the underlying search space. See P. Marquez-Silva. Grasp package. http://algos.inesc.pt/jpms/software.html. The use of BDD Bounding is an additional pruning technique, which allows for performing early backtracking without even invoking a BDD-based leaf computation.

Another difference of the disclosed technique from conventional techniques is in the granularity of the underlying search space. Since the focus is on the CNF formula for the transition relation, which is derived directly from a gate-level structural description of the design, a very fine-grained partition of the relation is obtained, which is also symmetric with respect to image and pre-image computations. This allows for splitting the overall into much finer partitions, where decision (splitting) variables can also be internal signals. Both BDD-based and SAT-based criteria are used for selection of these variables, e.g., estimate of cofactor BDD sizes, number of clauses a variable appears in, etc. See G. Cabodi, P. Camurati, and S. Quer. Improving the efficiency of BDD-based operators by means of partitioning. *IEEE Transactions on Computer-Aided Design of Integrated Circuits and Systems*, 18(5):545–556, May 1999. SAT-based criteria targeted towards finding multiple, and not single, solutions are also explored. For each partition itself, the finer level of granularity allows us to exploit the benefits of early quantification to a greater degree. This is reflected in the BDD-based quantification -schedule algorithm, which uses different criteria (actual BDD sizes) for selecting the =variable to be quantified, and is organized as a tree of conjunctions, rather than a linear series.

Finally, one of the aims of the disclosed technique is to combine SAT and BDDs in a seamless manner in order to facilitate a smooth and adaptive tradeoff between time and space for solving the image computation problem. In the disclosed algorithm, the move from SAT to BDDs occurs when a BDD sub-problem is triggered. Ideally, it is desirable to do this whenever it can be ensured that the BDDs would not blow up. However, there seems to be no simple measure to predict this a priori. Since CNF formulas and BDDs are entirely interchangeable, the boundary between SAT and BDDs is somewhat arbitrary. In principle, it is possible to freely intermix CNFs and BDDs for various parts of the circuit, and perform required analysis on the more appropriate representation. The disclosed technique is a step in this direction.

IV.F. Experiments

An embodiment of the image computation technique based on the CUDD BDD package and the GRASP SAT solver was implemented. For details on CUDD, see F. Somenzi et al. CUDD: University of Colorado Decision Diagram Package. http://vlsi.colorado.edu/fabio/CUDD/, and P. Marquez-Silva. Grasp package. http://algos.inesc.pt/jpms/software.html. This section describes the experimental results on some ISCAS benchmark circuits known to be difficult for reachability analysis. All experiments were run on an UltraSPARC workstation, with a 296 MHz processor, and 768 MB memory.

Only experiments for exact reachability analysis are focussed. Clearly, the disclosed techniques can be easily adapted and enhanced in many orthogonal directions such as its use in approximate reachability analysis, invariant checking, and model checking. 20 A comparison of this embodiment, which is called the CNF-BDD prototype, with VIS is shown in Table 1. For details in VIS, see R. K. Brayton et al. VIS: A system for verification and synthesis. In R. Alur and T. Henzinger, editors, *Proceedings of the International Conference on Computer-Aided Verification*, Volume 1102 of Lecture Notes in Computer Science, pages 428–432, June 1996. It shows results for performing an exact reachability analysis using pure breadth-first traversal on some benchmark circuits known to be difficult to handle in practice. The circuit name and number of latches are shown in Columns 1 and 2, respectively.

For the disclosed technique, a measure of circuit complexity is the number of variables appearing in our CNF representation of the transition relation-shown in Column 3. The number of steps completed is shown in Column 4, where a "(p)" indicates partial traversal. Column 5 reports the number of states reached. In Column 6, the CPU time taken (in seconds) by VIS is shown. For these experiments, a timeout of 10 hours is used. However, sometimes VIS runs into memory limitations before the timeout itself, indicated as "–" in this column. Columns 7 through 11 provide numbers for the CNF-BDD prototype. Column 7 reports the CPU time taken (in seconds). Columns 8 and 9 report the memory used, and the number of peak BDD nodes, as reported by the CUDD package. To give an idea of the efficiency of our modified SAT solver, the number of BDDs sub-problems (Leaves), and the number of backtracks due to BDD Bounding (Bounds) is reported in Columns 10 and 11, respectively. In all the experiments, any non-chronological backtracking in the SAT solver is not observed. Therefore, the total number of backtracks during image computation for all steps is the sum of Columns 10 and 11.

It can be seen that the performance of our CNF-BDD prototype is better than VIS in 3 of 4 circuits. For sl512, our prototype is worse likely due to the large number of steps—1024, and the overhead in every step of re-starting the SAT solver. For sl269, the prototype performs better than VIS by about a factor of 2. For both of these circuits, the CNF-BDD numbers are worse than those reported recently by, I.-H. Moon, J. Kukula, K. Ravi, and F. Somenzi. To split or to conjoin: The question in image computation. In *Proceedings of the Design Automation Conference*, pages 23–28, June 2000 —891 sec. for s1269, and 2016 sec. for s1512. The real gains from the disclosed technique can be seen in the more difficult circuits s1423 and s5378, where neither VIS nor our prototype can perform complete traversal. For sl423, VIS was able to complete up to step 11. For the same number of steps, our prototype is faster than VIS by more than a factor of 3. In fact, the prototype is able to complete two additional steps of the reachability computation in the time allotted compared to VIS. Similarly, for s5378, our prototype is faster than VIS up to step 6, and is able to complete 2 additional steps in the time allotted. As can be seen from the Columns showing Mem and Peak, the disclosed technique seems not to be memory bound yet, for these experiments. On the other hand, VIS gets memory bound in the allotted time. Furthermore, the number of backtracks is also well under control, with BDD Bounding being very effective in pruning the SAT search space. For all the experiments, the overhead of computing the BDD Bounding information was negligible.

TABLE 1

Results from Exact Reachability Analysis

| Ckt | # FF | # Vars | # Steps | # Reached States | Vis Time (s) | CNF BDD | | | | |
|---|---|---|---|---|---|---|---|---|---|---|
| | | | | | | Time (s) | Mem (MB) | Peak (M Nodes) | Leaves | Bounds |
| s1269 | 37 | 624 | 10 | 1.13E + 09 | 3374 | 1877 | 46 | 0.6 | 15150 | 5278 |
| s1512 | 57 | 866 | 1024 | 1.66E + 12 | 2362 | 6337 | 28 | 0.34 | 13289 | 3565 |
| s1423 | 74 | 748 | 11 (p) | 7.99E + 09 | 7402 | 2425 | 40 | 1.16 | 217 | 329 |
| | | | 13 (p) | 7.96E + 10 | — | 5883 | 274 | 6.86 | 330 | 452 |
| s5378 | 164 | 2978 | 6 (p) | 2.47E + 16 | 31346 | 19024 | 197 | 2.4 | 668 | 348 |
| | | | 8 (p) | 2.36E + 17 | — | 29230 | 202 | 2.4 | 981 | 421 |

TABLE 2

Results on Memory Usage for Circuit s1423

| S1423 Step | # Reached | Nano Trav Time (s) | Peak | Live | CNF-BDD Time (s) | Peak | Live | Leaves | Bound B |
|---|---|---|---|---|---|---|---|---|---|
| 1 | 545 | 2 | 14308 | 2627 | 0.7 | 22484 | 249 | 2 | 12 |
| 2 | 3345 | 2.5 | 19418 | 3847 | 4.9 | 31682 | 337 | 8 | 14 |
| 3 | 55569 | 5.6 | 32704 | 4010 | 4.1 | 42924 | 550 | 9 | 18 |
| 4 | 3.92E + 05 | 14.1 | 35770 | 6766 | 5.6 | 50078 | 1352 | 13 | 22 |
| 5 | 2.08E + 06 | 39.4 | 55188 | 15773 | 8.4 | 50078 | 2629 | 9 | 19 |
| 6 | 8.49E + 06 | 81.4 | 74606 | 19824 | 11.6 | 64386 | 6562 | 12 | 20 |
| 7 | 3.37E + 07 | 391.7 | 17696 | 35849 | 20.8 | 82782 | 13061 | 10 | 19 |
| 8 | 1.11E + 08 | 867.4 | 320908 | 64126 | 27.4 | 123662 | 33262 | 8 | 17 |
| 9 | 4.90E + 08 | 3050 | 888118 | 199237 | 125.4 | 224840 | 93492 | 34 | 61 |
| 10 | 1.68E + 09 | 7991.3 | 1634178 | 413060 | 521.8 | 531440 | 253527 | 58 | 72 |
| 11 | 7.99E + 09 | 18705.2 | 4027702 | 650065 | 1357.1 | 1168146 | 585034 | 51 | 55 |
| 12 | 2.30E + 10 | — | — | — | 2100.8 | 4259696 | 1538532 | 33 | 44 |
| 13 | 7.96E + 10 | — | — | — | 1694.3 | 6865796 | 4098655 | 80 | 79 |
| | | | | | 5882.9 | | | 327 | 452 |

To contrast the memory requirements of the disclosed technique with a standard purely BDD-based technique, detailed experiments were conducted for s1423. At this time, the VIS interface could not be changed in order to extract the memory usage statistics that was needed. Therefore, these experiments were conducted using a stand-alone traversal program called "nanotrav", which is distributed along with the CUDD package. See F. Somenzi et al. CUDD: University of Colorado Decision Diagram Package. http://vlsi.colorado.edu/fabio/CUDD/. In general, nanotrav performs worse than VIS, since it does not include sophisticated heuristics for early quantification or clustering of the partitioned transition relation. This limitation does affect the memory requirements to some extent, but Table 2 is presented mainly to show the overall trend. In this table, the number of steps and reached states is shown in Columns 1 and 2. For nanotrav, Column 3 reports the CPU time taken (in seconds). The number of peak nodes and live nodes at the end of each image computation are shown in Columns 4 and 5, respectively. Columns 6, 7, 8 report the same for our CNF-BDD technique. The number of BDDs at SAT Leaves (Leaves), and the number of backtracks due to BDD Bounding (Bounds) are aslo reported in Columns 9 and 10, respectively.

As can be seen clearly from this table, the memory requirements continue to grow with the number of steps. However, this growth is at a faster pace for nanotrav than it is for the CNF-BDD prototype. At the 11th step, the peak BDD nodes for nanotrav are greater than for CNF-BDD by a factor of 4. Not surprisingly, the CNF-BDD can complete two more reachability steps in about the same time. Furthermore, the CNF-BDD prototype is still not limited by memory while performing the 14th step, but is forced to time out after 10 hours.

In the disclosed technique, a tradeoff can be made between SAT solvers and BDDs by dynamically changing the conditions for triggering BDDs at SAT leaves. However, this only provides a memory-time tradeoff for the purpose of image computation. It does not reduce the memory requirements in using monolithic BDDs for representing state sets. As described in the earlier sections, the disclosed technique is completely suited for handling state sets in the form of disjunctive partitions (multiple BDDs). But clearly the prototype can be extended in this direction.

IV.G. Conclusions

In conclusion, an integrated technique for image computation which combines the relative merits of SAT solvers and BDDs, while allowing a dynamic interaction between the two is provided. In addition, the use of a fine-grained CNF formula provides the benefits of early quantification in the BDD sub-problems. This can potentially find application in purely BDD-based techniques as well.

Extension of the present techniques to other applications such as approximate traversal, invariant checking and CTL model checking are also within the scope of the present invention. Several enhancements to the basic image computation strategy are possible.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from IS the spirit and scope of the invention.

What is claimed is:

1. A method of performing image computation for a system, said method comprising:
   representing the system by a finite state model;
   representing state sets using Binary Decision Diagrams (BDDs);
   performing a satisfiabilty checking (SAT) based backtrack search algorithm,
   wherein,
      the SAT decomposes the search over an entire solution space into multiple sub-problems, and wherein
         a BDD-based image computation is used to solve each sub-problem by enumerating multiple solutions from the solution space.

2. The method of claim 1, further comprising:
   using above steps to perform exact or approximate reachability analysis.

3. The method of claim 1, further comprising:
   using above steps to perform exact or approximate invariant checking.

4. The method of claim 1, further comprising:
   using above steps to perform exact or approximate model checking.

5. The method of claim 1 wherein transition relation of the said finite state model is represented using a conjunctive normal form (CNF).

6. The method of claim 5, wherein the BDD-based image computation procedure determines the multiple solutions by:

creating a set of BDDs comprising a BDD for each unsatisfied clause in the CNF representation, adding an input set BDD to said set of BDDs, projecting partial assignment of variables on BDDs in said set of BDDs, choosing a minimum cost variable to quantify, said choice determined by a cost function depending upon:
sizes of BDDs in a subset of said set of BDDs, such that the chosen variable appears in each BDD of said subset,
an estimate of the size of product of BDDs in said subset,
sizes of variable support sets of BDDs in said subset,
number of variables that can be quantified;

performing conjunction of all BDDs in the subset, along with quantification of the chosen variable, and any other variables to be quantified which do not appear in remaining BDDs in the set of BDDs, the remaining BDDs being said subset removed from said set of BDDs;

replacing the subset of BDDs by result of the conjunction and quantification in the previous step;

iterating the steps of choosing a minimum cost variable, performing conjunction with quantification, and replacement until there are no more variables to be quantified, and performing a conjunction of the remaining BDDs in the set with a BDD representing a partial assignment of next-state variables.

7. The method of claim 1, wherein complement of a dynamically changing image set is used as a care-set within the search algorithm.

8. The method of claim 1, wherein the search in SAT is pruned by using BDD Bounding against an implicit disjunction or conjunction of a given set of BDDs, such that the search continues if a partial assignment to variables satisfies the implicit disjunction or conjunction, and backtracks otherwise, said BDD Bounding is further accomplished by applying said BDD Bounding against the implicit disjunction of BDDs which represent the input set, and applying said BDD Bounding against the implicit conjunction of BDDs which represent care sets for the image set.

9. The method of claim 1, wherein the disjunctive decomposition in SAT is accomplished by assigning values to decision variables chosen according to:

SAT-based heuristics, such as number of clauses a variable appears in; and

BDD-based heuristics, such as size of input set and care-set BDDs cofactored with respect to a variable.

10. The method of claim 1, wherein an extent of disjunctive decomposition in SAT is adaptive.

11. The method of claim 10, wherein a sub-problem associated with a BDD is initiated based on a cost function depending on a number of unassigned variables, size of Bounding BDDs after projection of assigned variables.

12. The method of claim 10, wherein a sub-problem associated with a BDD can be aborted even after initiation due to resource limitations, whereupon SAT is used to decompose the problem further.

13. A method of performing pre-image computation for a system, said method comprising:

representing the system by a finite state model;

representing state sets using Binary Decision Diagram (BDDs);

performing a satisfiabilty checking (SAT) based backtrack search algorithm, wherein,
the SAT decomposes the search over an entire solution space into multiple sub-problems, and wherein
a BDD-based pre-image computation is used to solve each sub-problem by enumerating multiple solutions from the solution space.

14. The method of claim 13, further comprising:

using above steps to perform exact or approximate reachability analysis.

15. The method of claim 13, further comprising:

using above steps to perform exact or approximate invariant checking.

16. The method of claim 13, further comprising:

using above steps to perform exact or approximate model checking.

17. The method of claim 13 wherein transition relation of the said finite state model is represented using a conjunctive normal form (CNF).

18. The method of claim 17, wherein the BDD-based pre-image computation procedure determines the multiple solutions by:

creating a set of BDDs comprising a BDD for each unsatisfied clause in the CNF representation, adding an input set BDD to said set of BDDs, projecting partial assignment of variables on BDDs in said set of BDDs, choosing a minimum cost variable to quantify, said choice determined by a cost function depending upon:
sizes of BDDs in a subset of said set of BDDs, such that the chosen variable appears in each BDD of said subset,
an estimate of the size of product of BDDs in said subset,
sizes of variable support sets of BDDs in said subset,
number of variables that can be quantified;

performing conjunction of all BDDs in the subset, along with quantification of the chosen variable, and any other variables to be quantified which do not appear in remaining BDDs in the set of BDDs, the remaining BDDs being said subset removed from said set of BDDs;

replacing the subset of BDDs by result of the conjunction and quantification in the previous step;

iterating the steps of choosing a minimum cost variable, performing conjunction with quantification, and replacement until there are no more variables to be quantified, and performing a conjunction of the remaining BDDs in the set with a BDD representing a partial assignment of present-state variables.

19. The method of claim 13, wherein complement of a dynamically changing pre-image set is used as a care-set within the search algorithm.

20. The method of claim 13, wherein
the search in SAT is pruned by using BDD Bounding against an implicit disjunction or conjunction of a given set of BDDs, such that the search continues if a partial assignment to variables satisfies the implicit disjunction or conjunction, and backtracks otherwise, said BDD Bounding is further accomplished by applying said BDD Bounding against the implicit disjunction of BDDs which represent the input set, and applying said BDD Bounding against the implicit conjunction of BDDs which represent care sets for the pre-image set.

21. The method of claim 13, wherein the disjunctive decomposition in SAT is accomplished by assigning values to decision variables chosen according to:

SAT-based heuristics, such as number of clauses a variable appears in; and

BDD-based heuristics, such as size of input set and care-set BDDs cofactored with respect to a variable.

22. The method of claim 13, wherein an extent of disjunctive decomposition in SAT is adaptive.

23. The method of claim 22, wherein a sub-problem associated with a BDD is initiated based on a cost function depending on a number of unassigned variables, size of Bounding BDDs after projection of assigned variables.

24. The method of claim 22, wherein a sub-problem associated with a BDD can be aborted even after initiation due to resource limitations, whereupon SAT is used to decompose the problem further.

25. A method for pruning a search space in a SAT procedure said method comprising:

using BDD Bounding against an implicit disjunction or conjunction of a given set of BDDs;

continuing search if a partial assignment of variables satisfies the implicit disjunction or conjunction, and backtracking if a partial assignment of variables does not satisfy the implicit disjunction or conjunction.

26. The method of claim 25, wherein

BDD Bounding against a single BDD is used multiple times for handling said disjunction, wherein search is continued if and only if a partial assignment of variables satisfies any BDD in the given set; and BDD Bounding against multiple BDDs is used for handling said conjunction.

27. The method of claim 26, wherein said BDD Bounding procedure against a single BDD is performed by:

setting values of assigned variables in a list; and determining that a partial assignment satisfies the BDD if there exists a path in the BDD to a "one" node in accordance with said values.

28. The method of claim 26 wherein said BDD Bounding procedure against multiple BDDs is performed by:

setting values of assigned variables in a list, traversing multiple BDDs in a lock-step manner in accordance with said values; and determining that a partial assignment satisfies the conjunction if there exists a path in the lockstep traversal of said BDDs that leads to a "one" node.

* * * * *